United States Patent [19]
Mansfield

[11] Patent Number: 5,973,495
[45] Date of Patent: Oct. 26, 1999

[54] METHOD AND APPARATUS FOR ELIMINATING MUTUAL INDUCTANCE EFFECTS IN RESONANT COIL ASSEMBLIES

[76] Inventor: Peter Mansfield, 68 Beeston Fields Dr., Nottingham, United Kingdom, NG9 3DD

[21] Appl. No.: 08/945,431

[22] PCT Filed: Apr. 26, 1996

[86] PCT No.: PCT/GB96/00988

§ 371 Date: Jan. 16, 1998

§ 102(e) Date: Jan. 16, 1998

[87] PCT Pub. No.: WO96/34296

PCT Pub. Date: Oct. 31, 1996

[30]      Foreign Application Priority Data

Apr. 28, 1995 [GB]   United Kingdom ................... 9508635

[51] Int. Cl.$^6$ ..................................................... G01V 3/00
[52] U.S. Cl. .......................... 324/322; 324/318; 324/319; 324/320

[58] Field of Search ................................. 324/309, 318, 324/316, 307, 300, 322, 319, 320

[56]            References Cited

U.S. PATENT DOCUMENTS 4,769,605   9/1988   Fox et al. ................................. 324/322
5,477,146  12/1995   Jones ....................................... 324/318

*Primary Examiner*—Christine K. Oda
*Assistant Examiner*—Brij B. Shrivastav
*Attorney, Agent, or Firm*—Jones & Askew

[57]            ABSTRACT

Method and apparatus for eliminating mutual inductance effects in resonant coil assemblies in which a plurality of coils are situated in sufficiently close proximity to create small mutual inductances between the coils. The method comprises evaluating the mutual inductances using a T, star or other transformation of the relevant parts of the circuit, thereby isolating the mutual inductances in such a way that series capacitances may be introduced to tune out the mutual inductances at a common frequency, reducing the coil array to a synchronously tuned circuit.

11 Claims, 11 Drawing Sheets

METHOD AND APPARATUS FOR ELIMINATING MUTUAL INDUCTANCE EFFECTS IN RESONANT COIL ASSEMBLIES

The present invention relates to a method and apparatus for elimination of mutual coupling in magnetic coils and more particularly to magnetic coils suitable for use in NMR or MRI systems.

There are many applications in nuclear magnetic resonance (NMR) and magnetic resonance imaging (MRI) where two or more coils are used to receive and/or transmit RF signals or pulses. In such situations it is desirable to have the two coils magnetically decoupled so that transmission or reception on one coil does not interfere with the transmission or reception on the second coil. The traditional way of dealing with the coil design problem is to have both coils geometrically orthogonal. A more recent development is one where two coaxial coils are made magnetically orthogonal by having the inner of the coaxial pair actively magnetically screened (P Mansfield and B Chapman, Active magnetic screening of gradient coils in NMR imaging. J Magn Reson 66, 573–576 (1986)); (P Mansfield and B Chapman, Active magnetic screening of coils for static and time dependent magnetic field generation in NMR imaging. J Phys E 19, 540–545 (1986)) and (P Mansfield and B Chapman, Multi-shield active magnetic screening of coil structures in NMR. J Magn Reson 72, 211–233 (1987)). However, with either magnetic or geometric orthogonality there is, in practice, a residual flux leakage from one coil to the other creating a mutual inductance which although small can lead to undesirable effects. For example, if both coils are tuned to a common resonant frequency, residual mutual coupling between the two coils will cause a splitting of the resonance response of the coil pair. This effect is particularly troublesome when the two coils are required to receive simultaneously signal from the same source (P Mansfield, A Freeman and R Bowtell, Active screening in RF coil design. MAGMA 2, 391–392 (1994)). Theoretical signal reception from the same source on two or more coils which have zero mutual inductance means that the signals can be independently received, amplified and co-added to give a signal-to-noise (S/R) enhancement. For a carefully designed system it may be possible to dispense with amplification of individual signals from each coil by co-adding the signals at the coil stage into a single signal with improved S/R which is then amplified in a single amplifier channel. This arrangement would be possible only if the relative phases of the two or more RF signals were $2\pi n$ where $n=0,1,2\ldots$ It is an object of the present invention to provide a way of eliminating mutual inductance effects in coil assemblies comprising two or more separate tuneable coils. The method uses passive electronic components to achieve the necessary decoupling and works best when one or more coils are tuned to a common frequency.

The present invention provides a method of eliminating mutual inductance effects in resonant coil assemblies in which a plurality of coils are situated in sufficiently close proximity to create small mutual inductances between the coils, the method comprising evaluating the mutual inductances using a T, star or other transformation of the relevant parts of the circuit thereby isolating the mutual inductances in such a way that series capacitances may be introduced to tune out the mutual inductances at a common frequency thereby reducing the coil array to a synchronously tuned circuit.

The invention also provides a method of eliminating mutual inductance effects in coil assemblies comprising three or more coils in which for a non-symmetric coil arrangement at least two non-equal capacitive elements are connected to respective coils. For two or more coils the method also comprises the steps of independently and optionally amplifying the signals received from the coils, phase compensating the signals and co-adding the signals.

The present invention also provides a coil system comprising two or more coils each coil output being tuned to the same operating frequency, the coils being positioned in sufficiently close proximity to create small mutual inductance couplings between the coils, and comprising capacitive elements which are connected in series with the mutual inductances and which are appropriately introduced to tune out the mutual couplings between the coils at the operating frequency.

Preferably in a two coil array the capacitive element which tunes out the mutual inductance is connected between one terminal of each coil and a return current/voltage line at earth potential.

Preferably in a symmetrical resonant three coil array a single capacitive element which tunes out the mutual inductance is connected between one terminal of each of the coils and a return current/ voltage line.

Preferably in a three or more non-symmetrical coil system at least two capacitive elements of non-equal value are connected to respective coils.

The coil system also preferably comprises for two or more coils electrical means for independently and optionally amplifying the signals received from the coils, means for phase compensating the signals and means for co-adding the signals.

In a preferred embodiment the coil system is provided with means for reducing the mutual coupling between coils, the capacitive element providing a substantially complete cancellation of any residual coupling between the coils.

In a first system the means for reducing the mutual coupling comprises an active magnetic screen so that the coils are magnetically orthogonal.

In a second system the means for reducing the mutual coupling comprises an arrangement in which the coils are geometrically orthogonal.

The present invention also provides a coil system comprising a petal arrangement of coils, one version of which is the petal arrangement including three groups of coil clusters each cluster comprising three coils. In a further petal arrangement seven coils are formed into a planar hexagonal array with the seventh coil at the array centre.

Embodiments of the present invention will now be described by way of example with reference to the accompanying drawings in which.

Figure 9:
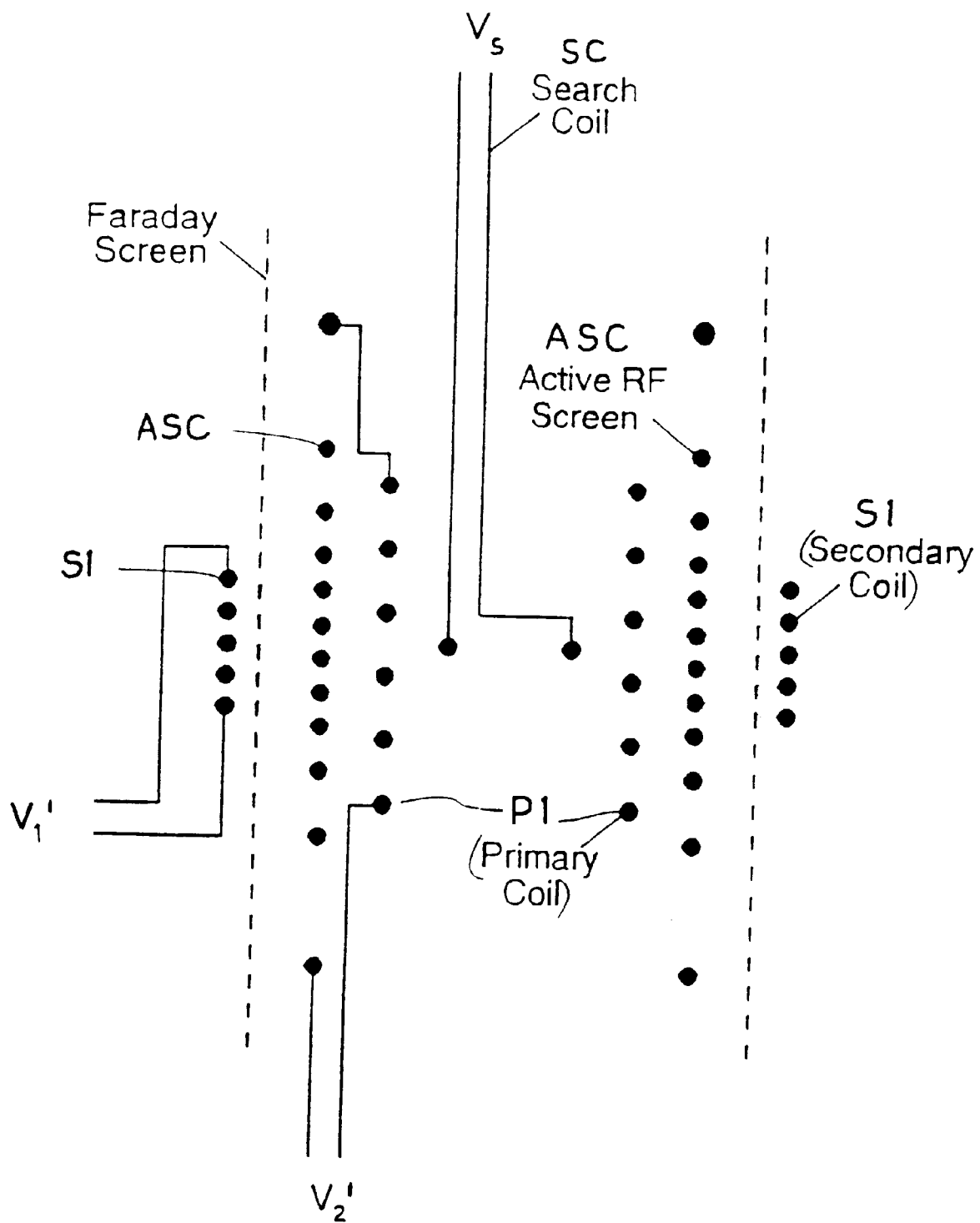
Figure 10:
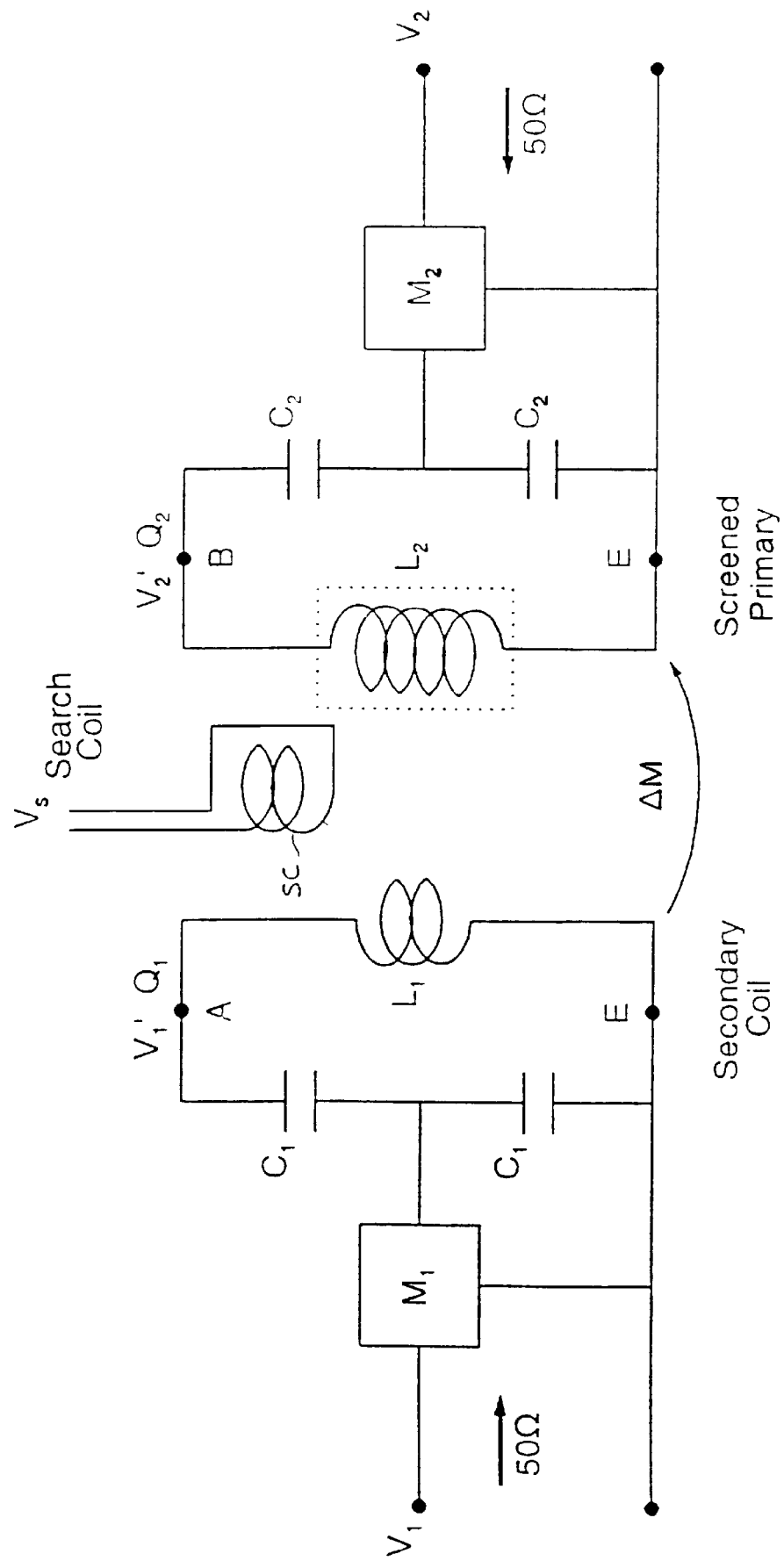
Figure 11:
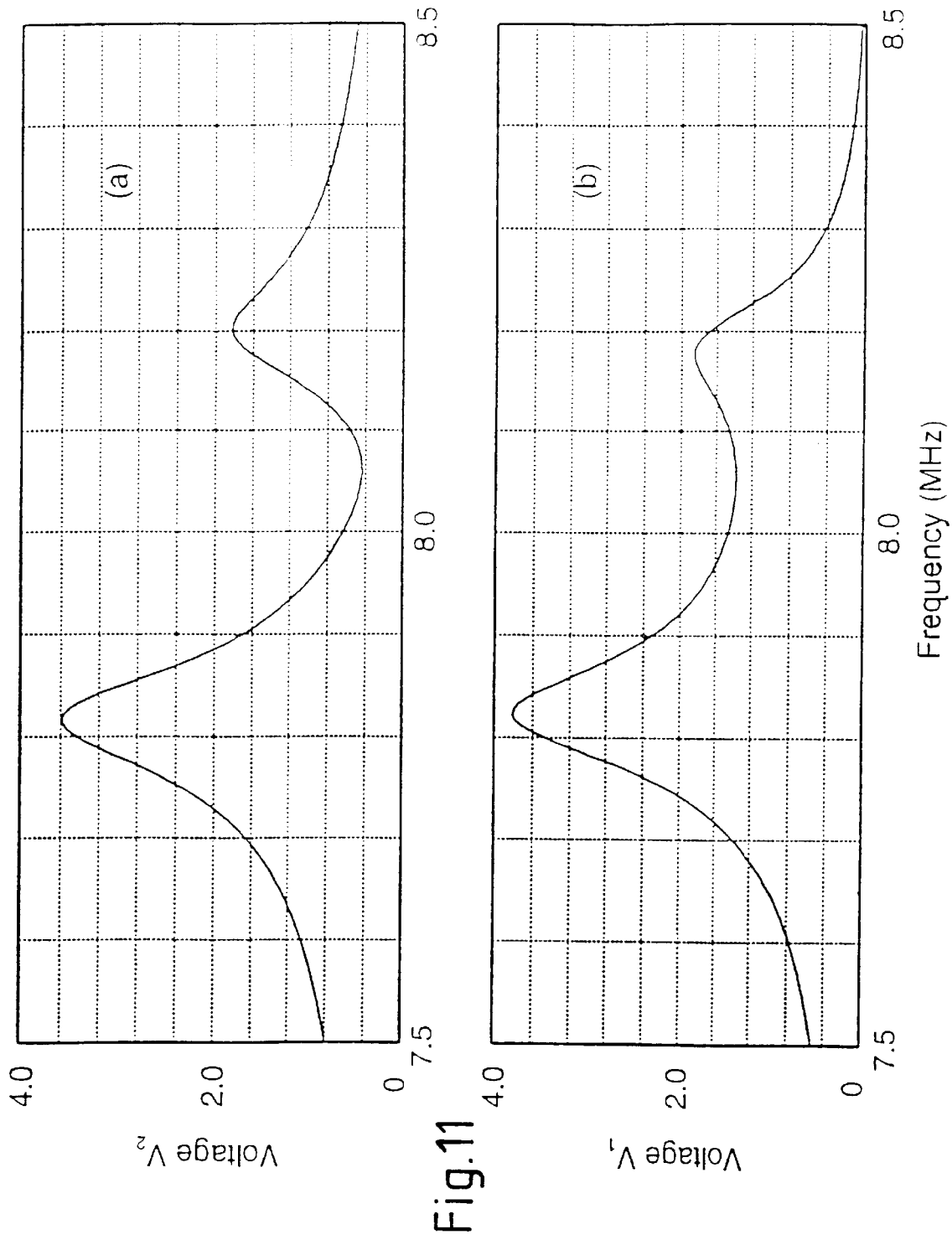
Figure 12:
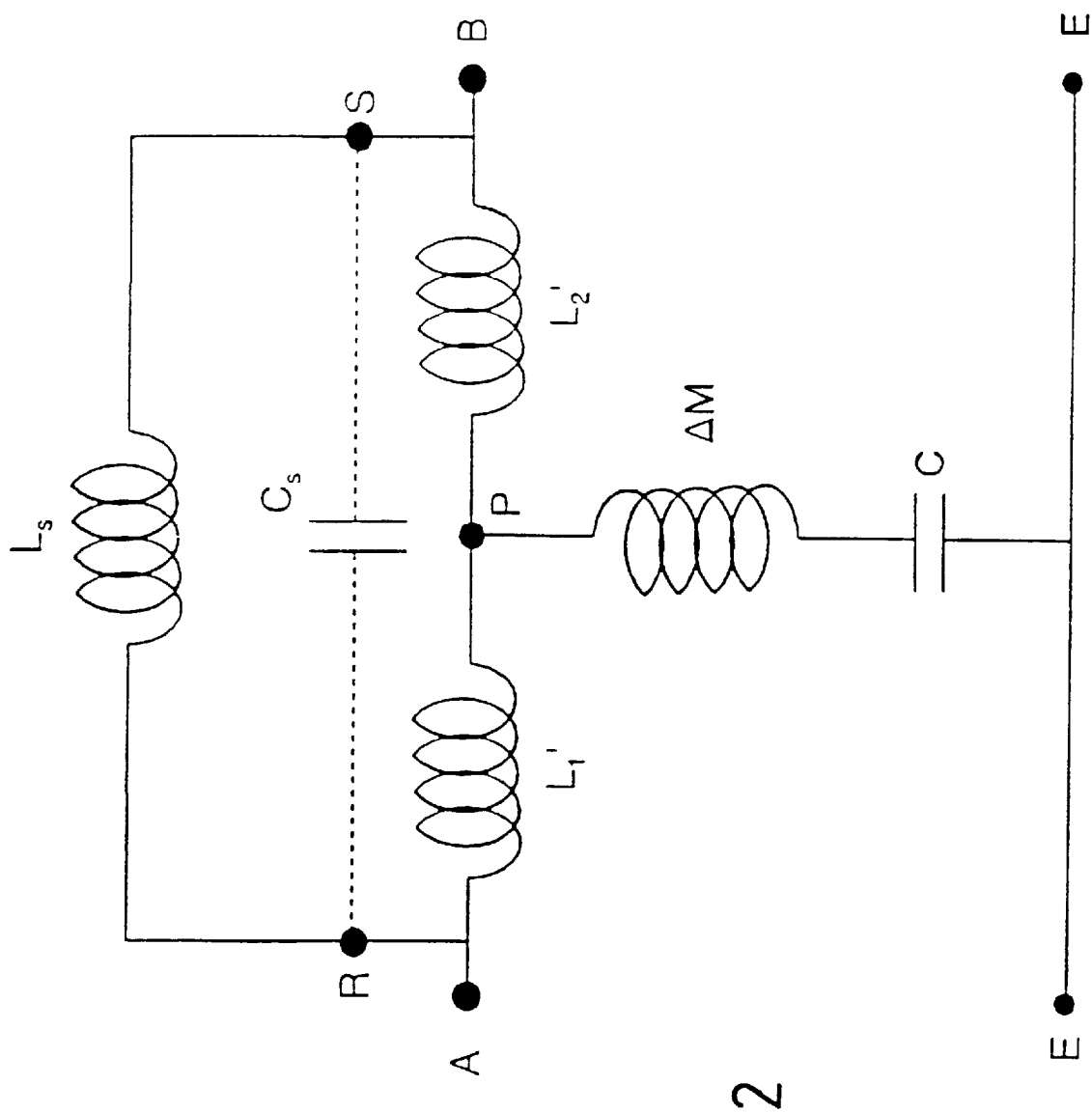
Figure 13:
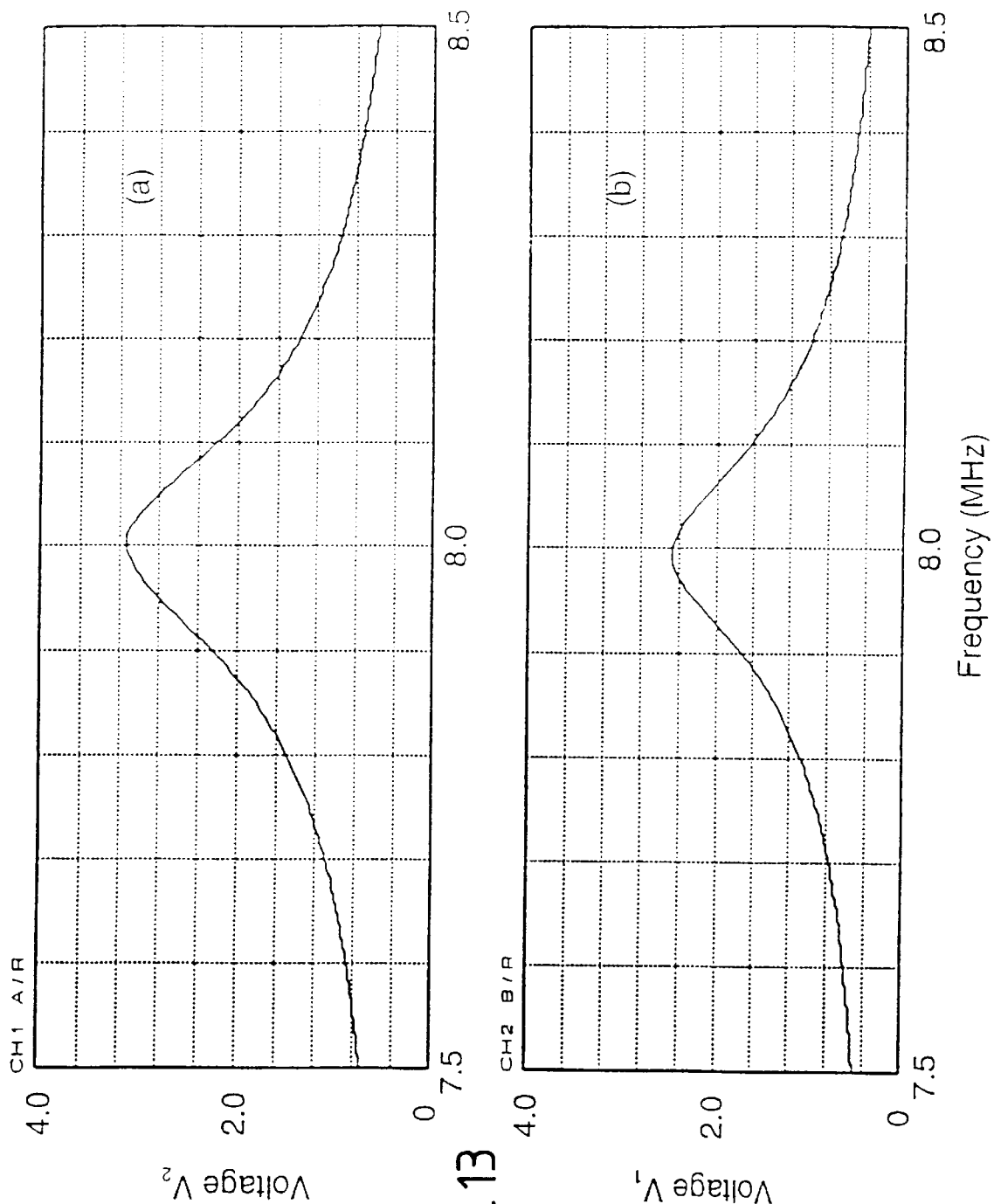
Figure 14:
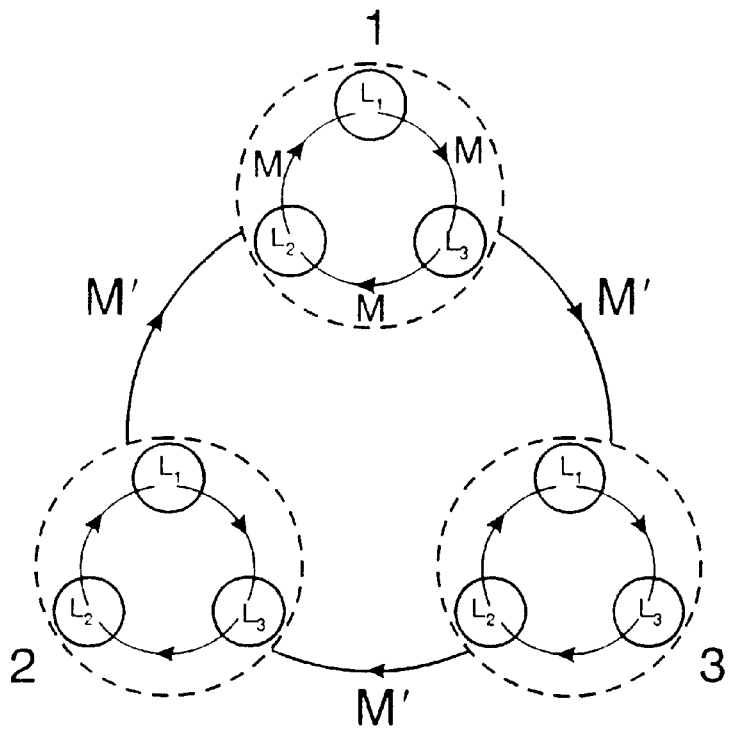
Figure 15:
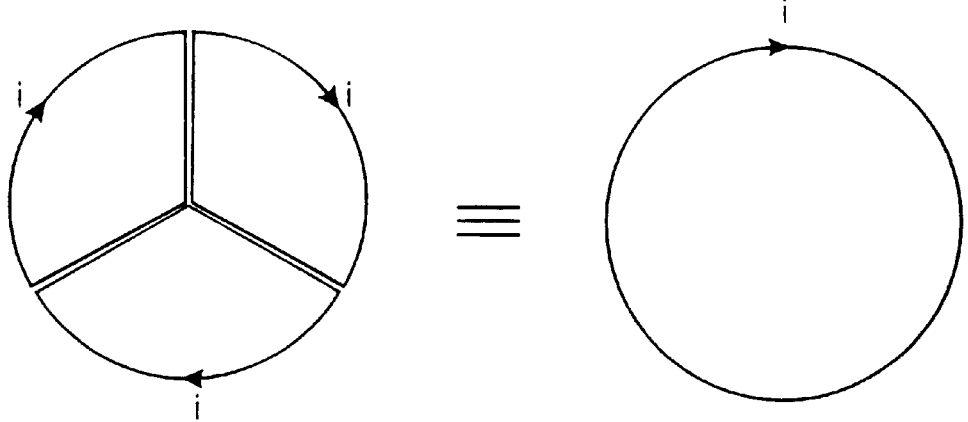
Figure 16:
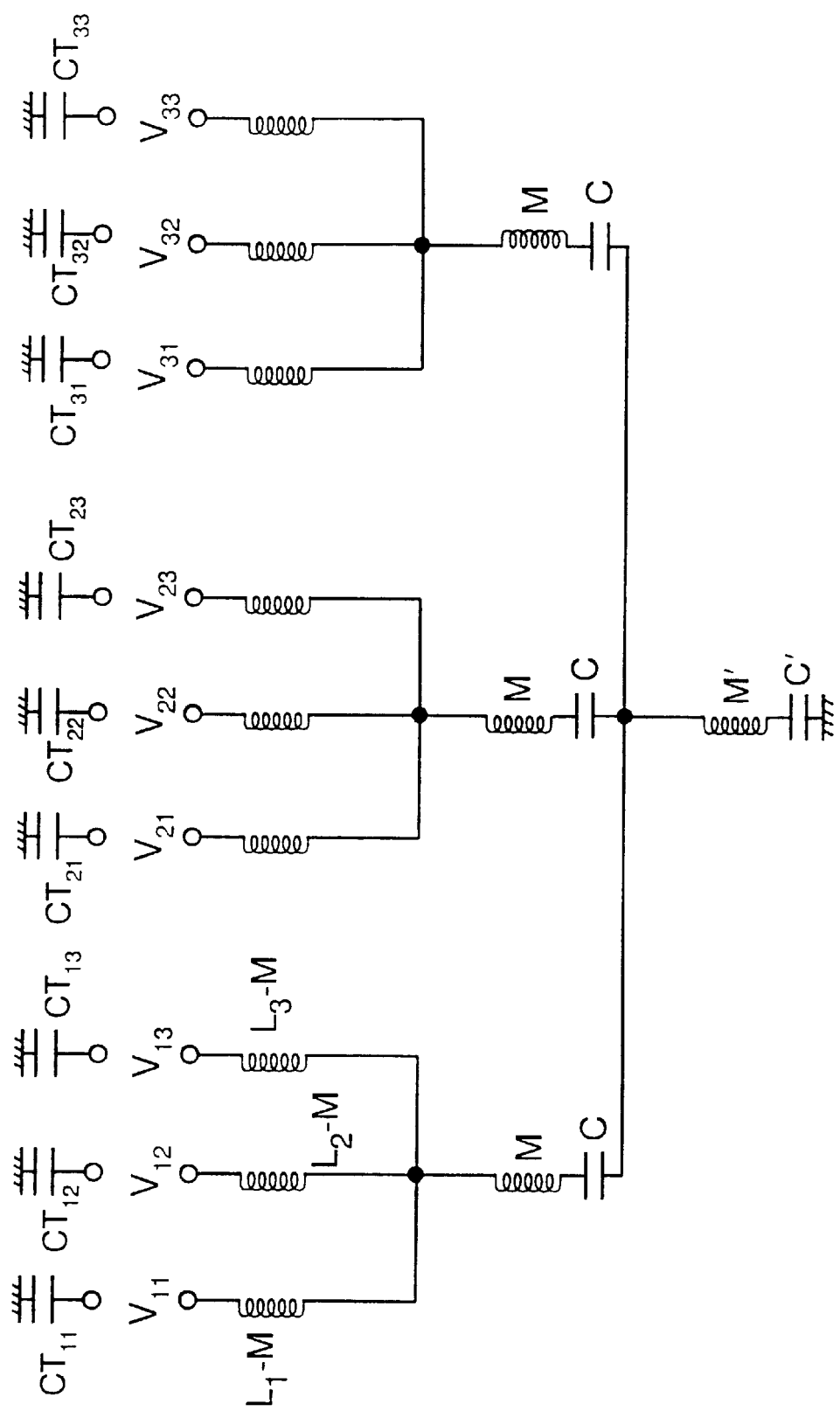

FIG. 9 is a diagram showing a coil arrangement in cross-section comprising an actively screened primary coil, a Faraday screen and the secondary coil co-axial with the primary coil axis but magnetically orthogonal to the primary coil. This circuit corresponds to the section AE-BE of FIG. 10. The output signal ports $V_1'$ and $V_2'$ and search coil input $V_S$ are also indicated;

FIG. 10 is a diagram of the test circuit arrangement for the magnetically orthogonal pair of coils of FIG. 9. In this is shown the tuning and matching arrangement for the magnetically screened primary and secondary RF coils with coil quality factors $Q_2$ and $Q_1$ respectively. The dotted line around the primary coil indicates that it is magnetically screened, thereby making the mutual inductance $\Delta M \cong 0$ between the screened primary and secondary coils the equivalent electrical circuit of the coil assembly between points AE and BE is shown in FIG. 12;

FIG. 11 is a graph showing the simulated response of the circuit of FIG. 10 when a mutual coupling between primary and secondary is present of value k=0.05. In this arrangement a resonance splitting of 0.35 MHz is observed on both the primary and secondary outputs labelled A and B respectively. In the example given the centre frequency is 8.0 MHz;

FIG. 12 shows an equivalent circuit of the screened primary and secondary section labelled AE and BE of the circuit of FIG. 10. The new inductances are given by $L_1'=L_1-\Delta M$ and $L_2'=L_2-\Delta M$. Additional components have been added, for example, C is a series tuning capacitor to resonate with $\Delta M$. Although there is a Faraday screen to effectively overcome the effects of stray capacitance, $C_S$, between the primary screen and secondary coil, an alternative arrangement is to add an inductor $L_S$ to tune out the effect of $C_S$ in a bridge-T arrangement;

FIG. 13 shows measured output voltages at the primary secondary ports of the circuit of FIG. 10 when the residual mutual inductance is tuned out as illustrated in FIG. 12. No bridge-T inductor, $L_S$, was necessary in these measurements. In this arrangement the NMR signal was simulated by applying a signal of 1.0 V to the search coil. The circuit responses were obtained using a network analyser centred around 8.0 MHz;

FIG. 14 is a sketch showing three groups each comprising three surface coils, inductances $L_1$, $L_2$ and $L_3$ with intra-group mutual coupling M and inter-group mutual coupling M';

FIG. 15 shows a group of three surface coils in the form of equal 120° segments and their magnetically equivalent single coil of equal total area demonstrating Ampere's circuital theorem;

FIG. 16 is the equivalent circuit for the nine coils of FIG. 14 when symmetrically placed together and with the tuning capacitors C, C' required to tune out the residual mutual inductances M, M'.

Figure 17:
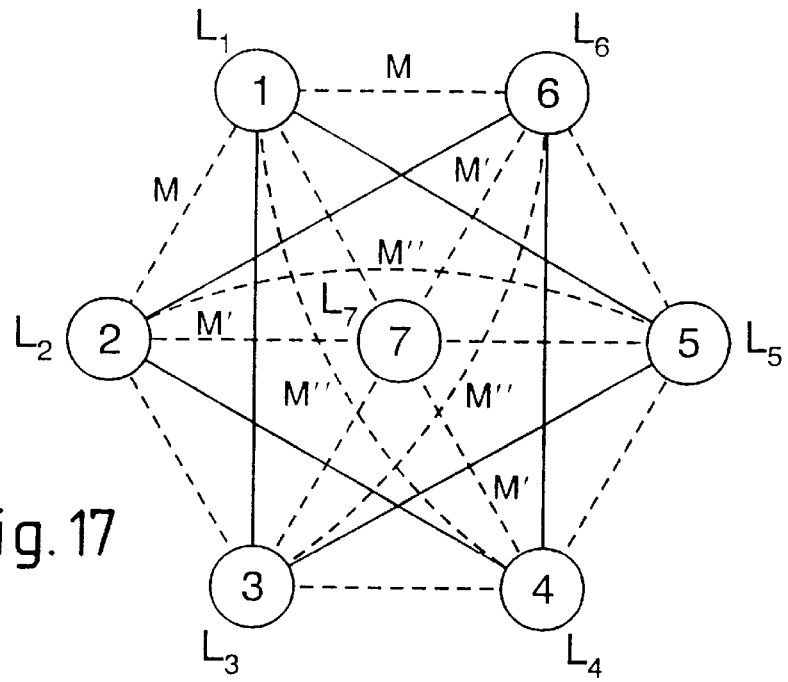

FIG. 17. Petal surface coil array comprising seven coils forming a hexagonal coil arrangement with a central coil. Also shown are all mutual inductance couplings. M denotes near neighbour, M' next near neighbour and M" next next neighbour mutual inductances. These are represented on the diagram as straight dotted lines, straight thin lines and curved dotted lines respectively, and FIG. 18. Equivalent circuit for the seven coil arrangement of FIG. 17. Provided M, M—M' and M—M" are tuned out with capacitors C, C' and C" respectively, all seven coils become completely decoupled so that by tuning all outputs to a common frequency or synchronous mode the four independent outputs may be co-added to give a single synchronous output response. Also added are phase equalisers, $\phi_n$, to make sure that all outputs add correctly.

Figure 1:
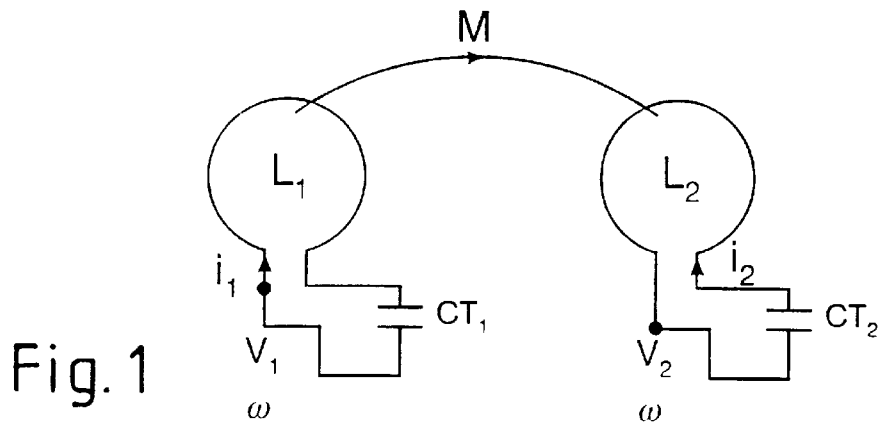
FIG. 1 is a sketch showing mutual coupling M between two coils of inductance $L_1$ and $L_2$ carrying currents $i_1$ and $i_2$ respectively each coil is driven at a common frequency $\omega$ with driving voltages $V_1$ and $V_2$ respectively.

With reference now to the drawings, consider two coils of inductance $L_1$, $L_2$ with mutual coupling M as sketched in FIG. 1. Tuning capacitors $CT_N$ or $CT_{N,M}$ in FIG. 1 and other figures are RF tuning capacitors introduced on all signal output ports to bring the various arrays into a synchronously tuned mode. Impedance matching of the RF signals at the coil output ports to the connecting cable characteristics will be required according to known principles—see for example FIG. 10.

We consider alternating voltages $V_1$, $V_2$ applied to each circuit at angular frequency $\omega$, producing in each inductance currents $i_1$ and $i_2$. Equations (1) and (2) describe the coupling between the two inductors.

$$V_1 = j\omega i_1 L_1 + j\omega i_2 M \tag{1}$$

$$V_2 = j\omega i_1 M + j\omega i_2 L_2. \tag{2}$$

These may be rewritten in terms of a common current $i=i_1+i_2$ to give $$V_1 = j\omega i_1 (L_1-M) + j\omega i M \tag{3}$$

$$V_2 = j\omega i M + j\omega i_2 (L_2-M) \tag{4}$$

Figure 2:
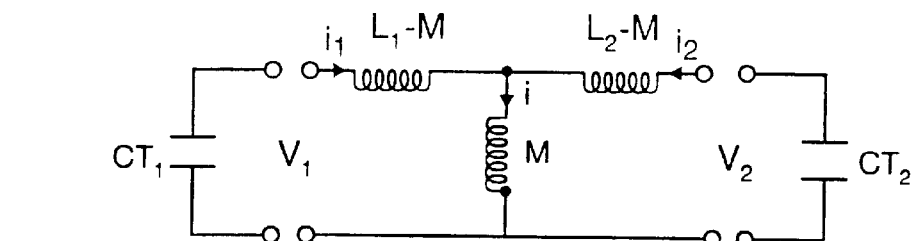
FIG. 2 shows the equivalent T-circuit for the coil arrangement of FIG. 1.
Figure 3:
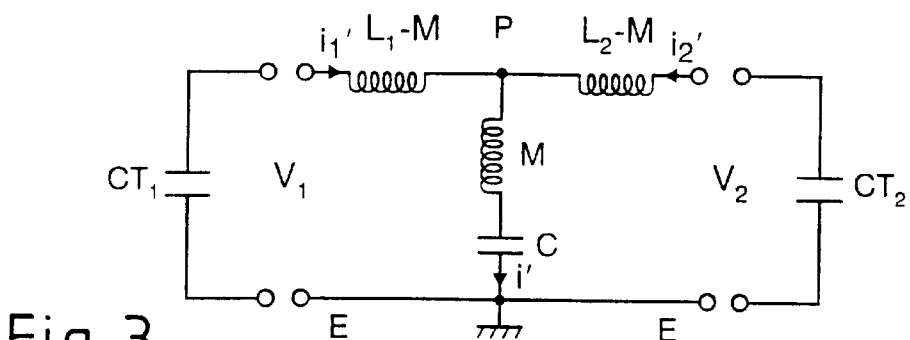
FIG. 3 shows the circuit of FIG. 2 with an added capacitor C in the mutual inductance arm allowing M to be tuned out thereby making point P effectively at earth potential. Note that for the same drive voltages as in FIG. 2 the circuit currents become $i_1'$, $i_2'$ and $i'$.
Figure 4:
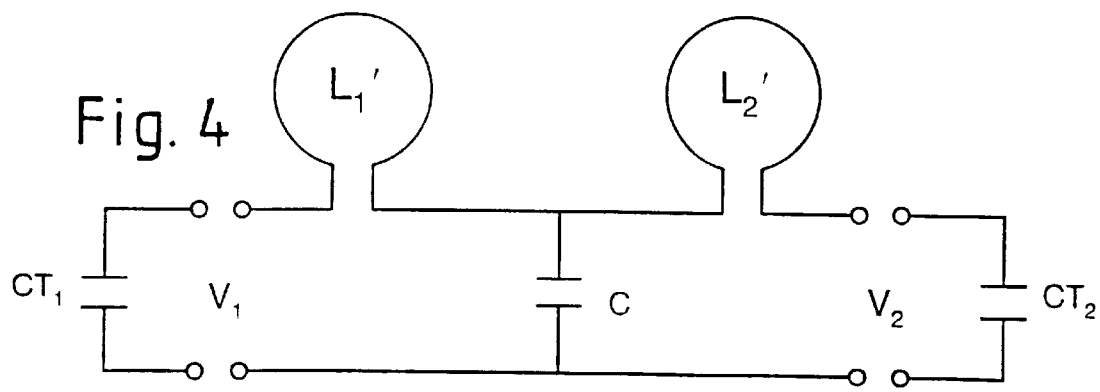
FIG. 4 shows the equivalent circuit of FIG. 3 showing the arrangement of coils with inductances $L_1'$ and $L_2'$ and the position of capacitor C in the wiring arrangement.

The equivalent T-circuit corresponding to Eqs. (3–4) is shown in FIG. 2. The mutual coupling M may be effectively removed in the central leg by tuning out with a capacitor C such that $\omega^2 = 1/MC$. The arrangement is shown in FIG. 3. When mutual inductance is tuned out, point P is effectively at earth potential, E. FIG. 3 can be redrawn as an actual circuit which is shown in FIG. 4, but now the effective inductors $L_1'=L_1-M$ and $L_2'=L_2-M$ are completely decoupled.

If M is $\ll L_1$, $L_2$, the inductance of each inductor is essentially unchanged. The mutual inductance M can be made very small in geometrically orthogonal coils. It can also be made very small in magnetically orthogonal coils.

Figure 5:
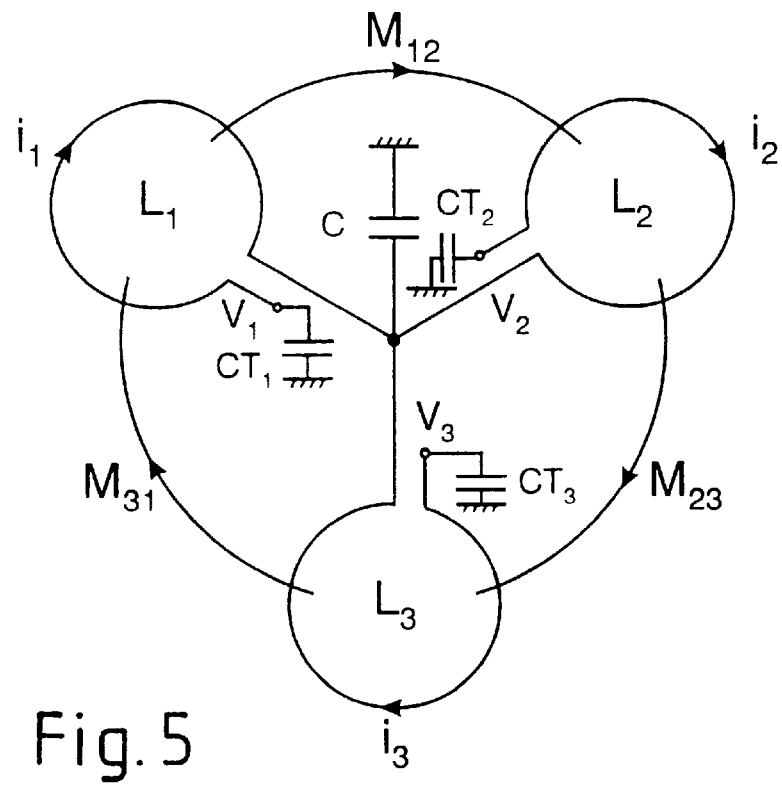
FIG. 5 shows a circuit having three coils of inductance $L_1, L_2$ and $L_3$ with mutual couplings $M_{12}$, $M_{23}$ and $M_{31}$ and where the coils carry currents $i_1$ $i_2$ and $i_3$ with drive voltages $V_1$, $V_2$ and $V_3$. For a symmetric arrangement with common mutual inductance M a capacitor C can be introduced which effectively removes the mutual coupling.

We now consider the case when we have three coils of inductance $L_1$, $L_2$ and $L_3$ with mutual coupling $M_{12}$, $M_{23}$ and $M_{31}$. The coil arrangement is shown in FIG. 5. By reciprocity $M_{12}=M_{21}$ etc. The equations coupling the three coils are given by $$V_1 = j\omega i_1 L_1 + j\omega i_2 M_{12} + j\omega i_3 M_{31} \tag{5}$$

$$V_2 = j\omega i_1 M_{12} + j\omega i_2 L_2 + j\omega i_3 M_{23} \tag{6}$$

$$V_3 = j\omega i_1 M_{31} + j\omega i_2 M_{23} + j\omega i_3 L_3 \tag{7}$$

where $V_1$, $i_1$, etc. are the voltages and currents in each inductor. Let the coil arrangement be symmetric so that $M_{12}=M_{23}=M_{31}=M$ and $L_1=L_2=L_3$. We can now rewrite Eqs. (5, 6 and 7) introducing the common current $i=i_1+i_2+i_3$ in which case we may write $$V_1 = j\omega i_1 (L_1-M) + j\omega i M. \tag{8}$$

$$V_2 = j\omega i_2(L_2-M) + j\omega iM \quad (9)$$

$$V_3 = j\omega i_3(L_3-M) + j\omega iM \quad (10)$$

Figure 6:
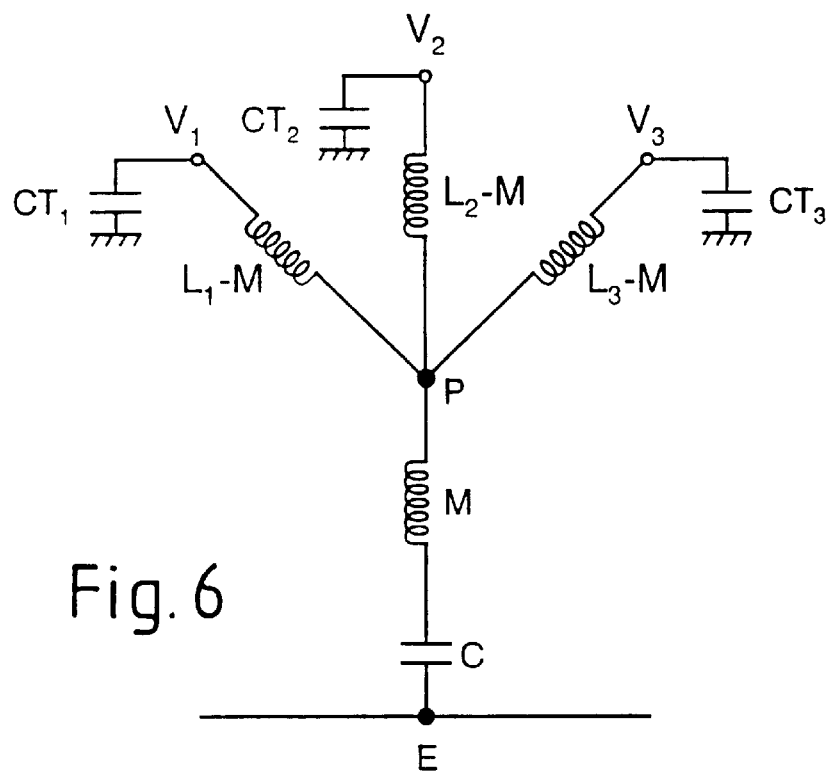
FIG. 6 shows the equivalent branch circuit of FIG. 5 in the symmetric arrangement showing the tuning capacitor C.

The equivalent circuit for Eqs. (8–10) is shown in FIG. 6 with an additional capacitor C to tune out the mutual inductance. Again as with two coils the point P is effectively earthed when $\omega^2 = 1/MC$, and in this case all three coils are magnetically decoupled. If $M << L_1, L_2, L_3$, the array of three coils can receive signals independently of each other. This arrangement would therefore have a useful application in a surface coil design where the three independent signals $V_1$, $V_2$ and $V_3$ can be received independently, suitably phase adjusted and then co-added to give an improvement in signal-to-noise (S/N) ratio provided the noise source for each coil is uncorrelated. This is the case when the mutual inductance effectively vanishes.

Figure 7:
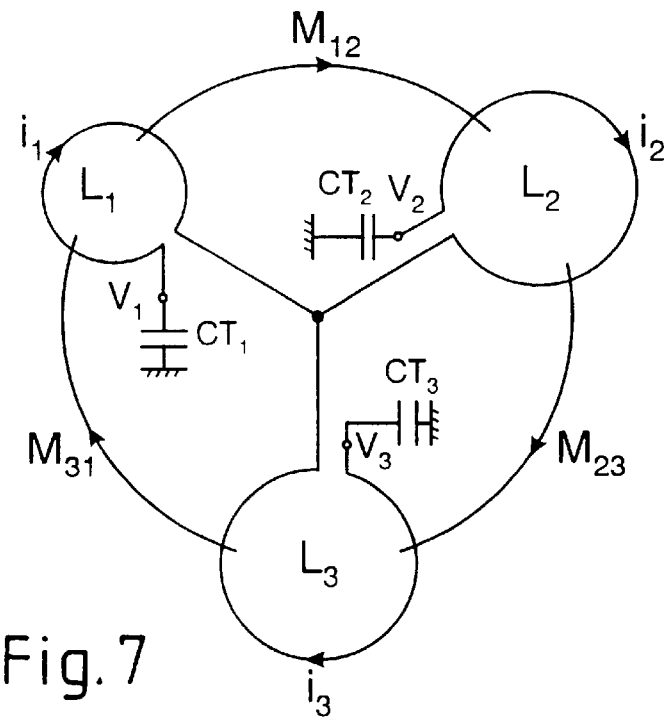
FIG. 7 is a sketch showing three coils in a non-symmetrical arrangement.

If the three coils are non-symmetric as shown in FIG. 7, it is still possible to obtain the decoupled equivalent circuit. In this case we take the coil inductors $L_1$, $L_2$ and $L_3$ as being unequal. We also assume initially that $M_{12}$, $M_{23}$ and $M_{31}$ are all different. This means that there is no single tuning capacitor which will simultaneously tune all three coil inductances. To simplify matters we will consider the situation when a pair of mutual inductances are equal. In this case the circuit can be simplified. Let $M_{12}=M_{23}M_1$, and $M_{31}=M_2$. We further take a case when $M_2$ is less than $M_1$ and let $M_2-M_1=\Delta M$. The coupling equations under these conditions are $$V_1 = j\omega i_1 L_1 + j\omega i_2 M_1 + j\omega i_3 M_2 \quad (11)$$

$$V_2 = j\omega i_1 M_1 + j\omega i_2 L_2 + j\omega i_3 M_1 \quad (12)$$

$$V_3 = j\omega i_1 M_2 + j\omega i_2 M_1 + j\omega i_3 L_3. \quad (13)$$

By introducing the above constraints, Eqs. (11–13) may be reduced to $$V_1 = j\omega i_1 L_1 + j\omega i_2(M_2-\Delta M) + j\omega i_3 M_2. \quad (14)$$

$$V_2 = j\omega i_1(M_2-\Delta M) + j\omega i_2 L_2 + j\omega i_3(M_2-\Delta M) \quad (15)$$

$$V_3 = j\omega i_1 M_2 + j\omega i_2(M_2-\Delta M) + j\omega i_3 L_3. \quad (16)$$

Figure 8:
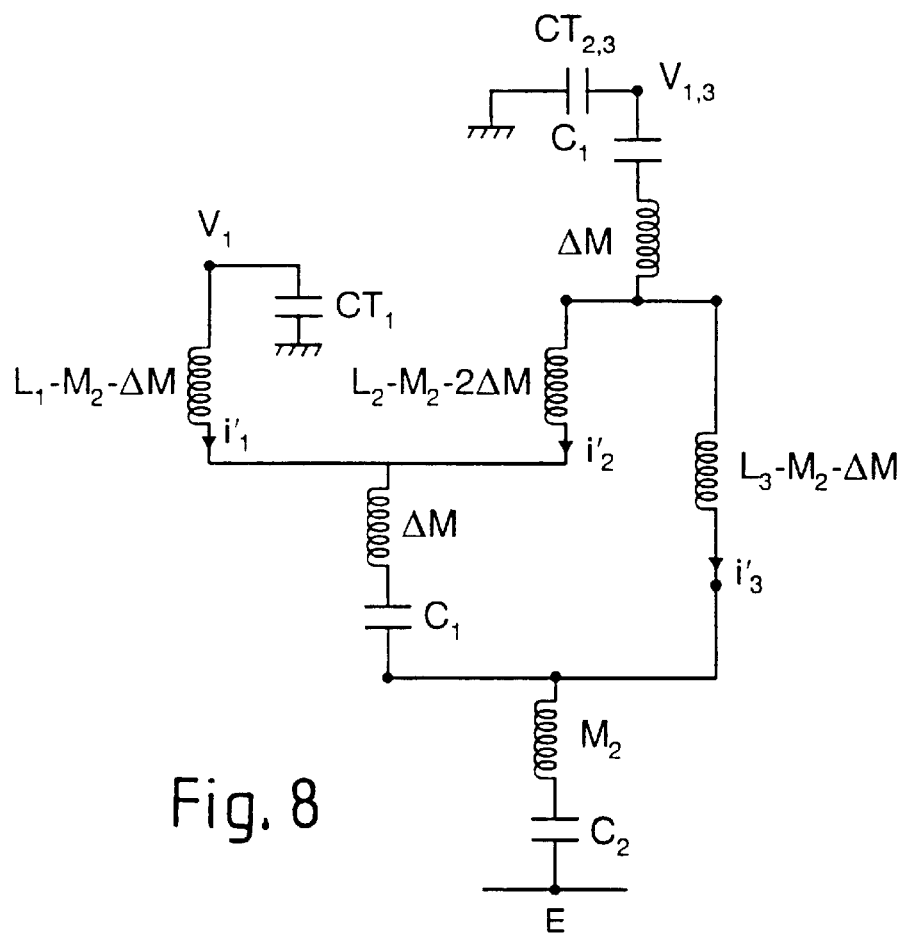
FIG. 8 shows an equivalent branch circuit equivalent to FIG. 7 but with additional capacitors $C_1$ and $C_2$ to tune out the residual mutual inductances $\Delta M$ and $M_2$. Note that the primes denote slightly different current values to those in FIG. 7.

By rearranging Eqs. (14–16) we obtain $$V_1 = j\omega i_1(L_1-M_2) - j\omega i_2 \Delta M + j\omega i M_2 \quad (17)$$

$$V_2 = -j\omega i_1 \Delta M + j\omega i_2(L_2-M_2) + j\omega i M_2 - j\omega i_3 \Delta M \quad (18)$$

$$V_3 = -j\omega i_2 \Delta M + j\omega i M_2 + j\omega i_3(L_3-M_2) \quad (19)$$

in which we have introduced a common current $i = i_1 + i_2 + i_3$. The form of Eqs. (17–19) indicates that there is no single capacitor which allows simultaneous tuning of all mutual inductances. The equivalent circuit, therefore, of Eqs. (17–19) is shown in FIG. 8. In FIG. 8 it is necessary to introduce two tuning capacitors $C_1$ and $C_2$ in the arrangement sketched in order to simultaneously remove all mutual inductance effects. Extension of the above ideas to more loops and other geometries will be obvious to anyone skilled in the art.

There are several potential applications where the removal of mutual coupling between a pair of coils is beneficial. In all arrangements it is necessary to have the mutual inductance very small compared with the initial coil inductances in order to fully benefit. One situation is where the two coils are mechanically orthogonal. Such an arrangement naturally minimises mutual coupling between two coils and it is well known that residual mutual coupling remains and can vitiate the combined electrical response of the coil pair. For example, if the residual mutual coupling $\Delta M$ is non-zero, a resonant splitting of the frequency response of the two coils results. This splitting is given by $$\Delta\omega \approx k\omega_o/(1-k^2) \quad (20)$$

where the coupling constant, k, is defined by $$\Delta M = k\sqrt{L_1 L_2} \quad (21)$$

and $L_1$, $L_2$ are the respective inductances of the two coils. The effect of mutual inductance can be reduced to zero by tuning out $\Delta M$ in the way described hencebefore. This then effectively makes the two coils synchronously tuned giving a single unsplit frequency response. The same idea applies in the case of a pair of magnetically orthogonal coils. Such an arrangement can be achieved even with a pair of geometrically coaxial coils by actively magnetically screening the first coil P1 by means of an active screen coil ASC and winding the second coil S1 over the first magnetically screened coil. The arrangement is shown in FIG. 9. Residual mutual inductance $\Delta M$ between the primary P1 and secondary S1 coil can be made quite small, but never exactly zero so that there is benefit in using the principles of tuning out mutual inductance as described hencebefore.

Applications involving three or more coils exist for the design of surface coils for magnetic resonance imaging applications (P Mansfield, The petal resonator: a new approach to surface coil design for NMR imaging and Spectroscopy. J Phys D 21, 1643–1644 (1988)); (P Mansfield and R Coxon, The petal resonator: a new approach to surface coil design—experimental results. Proc SMRM 7th An Meeting, works in progress, p 156 (1988)). In surface coil design the object is to replace one large receiver coil which is placed on the surface of a subject by a set of smaller coils. The principle behind such an arrangement is that the effective noise resistance which arises through magnetic coupling of the patient with the surface coil reduces as the radius of the surface coil is reduced. This means that there is advantage in replacing one single large loop by a set of smaller loops provided that the signals from the smaller loops can be received independently of each other. This means that the mutual coupling between the smaller loops must be effectively zero. Even if the total area of the smaller loops is less than the total area of the single loop that they are replacing, it has been shown elsewhere (P Mansfield, The petal resonator: a new approach to surface coil design for NMR imaging and Spectroscopy. J Phys D 21, 1643–1644 (1988)) that there is a potential S/R advantage. The equivalent surface coil array is called a petal array and in work described elsewhere an adequate method of decoupling the circuit petals in the array was not described. The mutual residual coupling between the petals limited the efficacy of such an arrangement. By utilising the above described cancellation method it should now be possible to design surface coil arrays in which the separate coils are completely decoupled.

FIG. 10 shows the test circuit diagram for a two coil magnetic orthogonal arrangement which is synchronously tuned to 8.0 MHz. A search coil SC introduces a small magnetic coupling to both $L_1$ and $L_2$ the residual mutual coupling between $L_1$ and $L_2$ is $\Delta M$. Signal is measured on the output ports $V_1$ and $V_2$ via their respective 50 $\Omega$ matching units $M_1$ and $M_2$. FIG. 11 shows the simulated output responses for a residual coupling constant k=0.05 corresponding to a resonance splitting of 0.35 MHz which is observed on both ports FIG. 11(a) and (b). When the central part of the circuit AE-BE is replaced by its equivalent circuit FIG. 12 in which a capacitor C is introduced to tune out ΔM the experimental response obtained is shown in FIG. 13. The residual splitting is now completely removed producing a synchronously tuned output on both ports. Additional components have been added to FIG. 12 across AB in a bridge-T arrangement the stray capacitance $C_S$ between the two coils can itself be tuned out with an inductance $L_S$. This is an alternative arrangement to introducing a Faraday screen. In the synchronous mode the signals $V_1$ and $V_2$ can now be coadded to produce an output with an improved S/N ratio since both output signals have a 50 Ω source impedance.

We have already discussed in some detail the theory of three interacting surface coils. We now consider the application of this theory for the case where we consider three groups of three surface coils. The arrangement is sketched in FIG. 14. Let the inductors in each group be $L_1$, $L_2$ and $L_3$. Let the common mutual inductance between all three coils be M. Although we have considered each group to comprise three circular coils it is possible as an alternative arrangement to have the triplet of coils made up of three 120° segments as shown in FIG. 15. In this case the total area of the three coils is equal to one single coil as shown and the inductors are all equal to L. If one thinks of the coil arrangement in these terms and when carrying a common current i as indicated, then by Ampere's circuital theorem the triplet arrangement is magnetically equivalent to one large coil of equal total area. This being the case we may now return to the three groups FIG. 14, and invoke a common inter-group mutual inductance M'.

For an individual group we have already shown hencebefore that the equivalent circuit is represented by one branch of FIG. 16. From the foregoing, the intra-group mutual inductance, M can be tuned out by introducing capacitor C. The output voltages for group one are $V_{11}$, $V_{12}$ and $V_{13}$ the other two groups can be similarly represented. By invoking the three inductor coupling theory again the capacitors from all three groups can be combined into an equivalent circuit in which the inter-mutual inductance M' can be tuned out with a further capacitor C'.

The resulting combination of nine coils will produce nine separate outputs which may all be subsequently combined, together with any necessary phase adjustments to give a single output with improved S/N ratio. The phase adjustments could be done by introducing separate phase shifters into each coil output. In RF applications all outputs can be individually tuned to a common RF frequency. With removal of all mutual couplings the RF response produces a synchronous mode.

Addition of all signals may be effected by feeding all signals to a suitable adding network. This may be done before or after amplifier buffering.

In the foregoing section on petal arrays we have been primarily concerned with either clusters of three coils or groups of three clusters. This approach has allowed us to draw upon the simple three coil theoretical analysis.

We now turn to a more complicated petal array in the form of a hexagonal coil arrangement with a central coil. In total there are therefore seven flat circular coils as indicated in FIG. 17. Of course the arrangement could be extended to include coil shapes other than circular. In FIG. 17 we also indicate all the mutual couplings. The near neighbour mutual couplings of all coils including the centre coil are denoted as straight dotted lines with mutual inductance M. The next nearest neighbour interactions are denoted by thin straight lines coupling coils 1, 3 and 5 or 2, 4 and 6 with equal mutual inductances of M'. The next next nearest neighbour couplings are diagonal connecting coils 1 and 4, 2 and 5 and 3 and 6. These couplings are denoted by curved dotted lines with a common mutual inductance of M".

Figure 18:
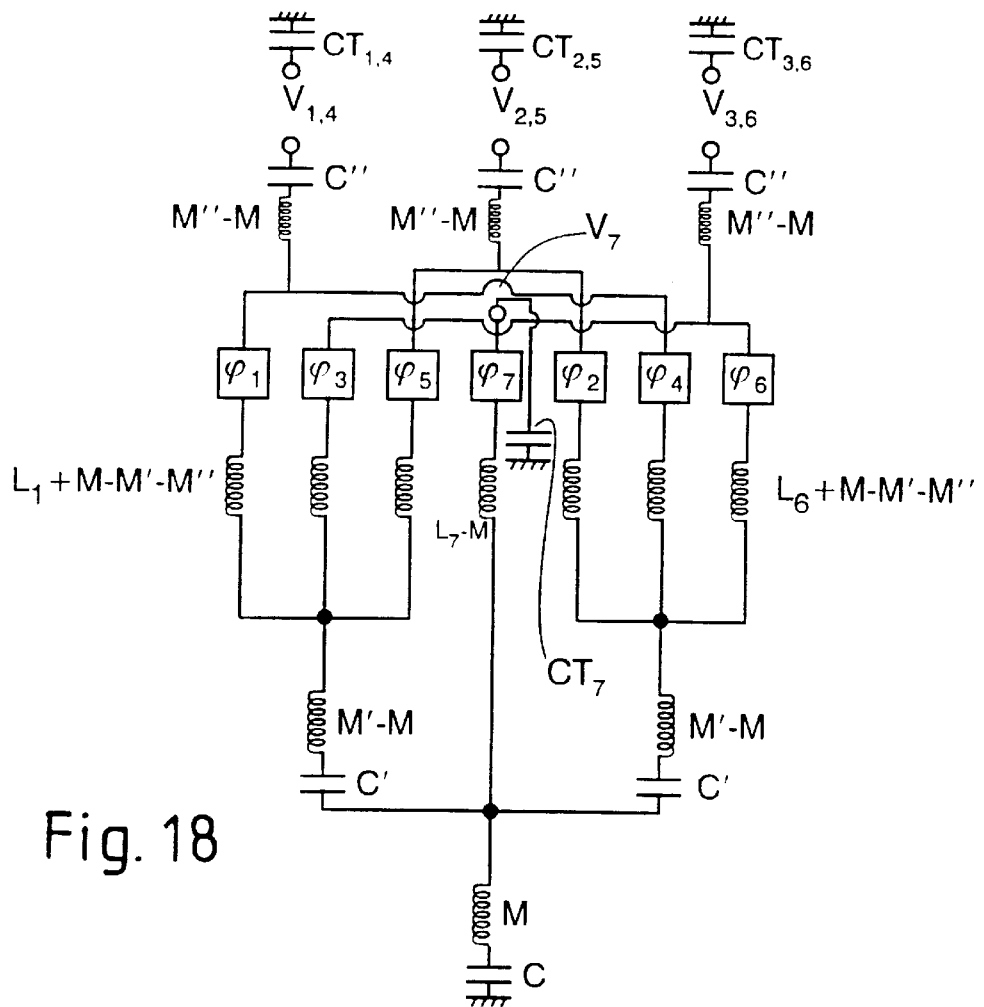

There are seven equations describing the complete coupling arrangement for these coils and these equations indicate an equivalent circuit as shown in FIG. 18. We have added in capacitors C, C' and C" to tune out the mutual couplings M, M'−M and M"−M respectively. We have also added in phase shifters $\phi_1, \phi_2, \ldots \phi_7$ to compensate for any phase variation of the RF signal generated across the petal array. For low RF frequencies we would not expect much if any phase variation.

Apart from $V_7$, the outputs from this circuit are coupled in pairs $V_{1,4}$, $V_{2,5}$ and $V_{3,6}$. All the outputs can now be tuned to a common frequency or synchronous mode with no mode splitting. The outputs may further be co-added to give a signal with improved S/N. However the matching arrangement for such an adding procedure will be different for output 7. This is because the three paired outputs will have a lower output impedance than the single coil arrangement. In general for equal inductances and for relatively small mutual couplings one would expect the output impedance for the paired coils to be approximately one half the output impedance for the single coil, 7.

We claim:

1. A method of eliminating mutual inductance effects in resonant coil arrays comprising a plurality of coils forming a group situated in sufficiently close proximity to create small mutual inductances between the coils, which array may be divided into sub-groups comprising inductors with common mutual inductances, the method comprising evaluating the common mutual inductances using a T, star, or other transformation of the relevant parts of the circuit thereby isolating the common mutual inductances through which flow the sum of the currents which pass through the sub-group of inductors; and for each sub-group, connecting a capacitor in such a way as to pass the sum of the currents passing through the sub-group, each capacitor of each sub-group being tuned to remove at least part of the mutual coupling within each of the sub-groups, thereby reducing the coil array to a synchronously tuned circuit.

2. A resonant coil system comprising a plurality of coils forming a group arranged in a resonant coil array, the coils being situated in sufficiently close proximity to create small mutual inductances between the coils, which array is divided into sub-groups comprising inductors with common mutual inductances and including capacitive elements; and characterized in that for each sub-group a said capacitive element is connected in such a way as to pass the sum of the currents passing through the sub-group, each capacitor of each sub-group being tuned to remove at least part of the mutual coupling within each of the sub-groups, thereby reducing the coil array to a synchronously tuned circuit.

3. A resonant coil system as claimed in claim 2 comprising a two coil array the capacitive element, which tunes out the mutual inductance, being connected between one terminal of each coil and a return current/voltage line at earth potential.

4. A resonant coil system as claimed in claim 2 comprising a symmetrical resonant three coil array in which a single capacitive element which tunes out the mutual inductance is connected between one terminal of each of the coils and a return current/voltage line.

5. A resonant coil system as claimed in claim 2 in which in a three or more non-symmetrical coil array at least two capacitive elements of non-equal value which are connected to respective coils to tune out the mutual inductances.

6. A coil system as claimed in claim 2 in which the coil system is provided with means for initially reducing the mutual coupling between coils to create the small mutual inductance coupling which comprises a residual coupling, the capacitive element providing a substantially complete cancellation of the residual coupling between the coils.

7. A coil system as claimed in claim 6 in which the means for initially reducing the mutual coupling comprises an active magnetic screen so that the coils are magnetically orthogonal.

8. A coil system as claimed in claim 6 in which the means for initially reducing the mutual coupling comprises an arrangement in which the coils are geometrically orthogonal.

9. A resonant coil system as claimed in claim 2 comprising a petal arrangement of coils, the petal arrangement including three groups of coil clusters each cluster comprising three coils.

10. A resonant coil system as claimed in claim 2 comprising a petal arrangement of coils forming a hexagonal coil array with a central coil.

11. Electrical means for independently and optionally amplifying the separate signals on the various output ports received from any of the coils in claims 2 to 9 including means for phase compensating the separate signals and means for co-adding the signals pre or post amplification and means for impedance matching of the RF signals at the coil ports to the connecting cable characteristics.

* * * * *